United States Patent
Chan et al.

(10) Patent No.: US 9,847,357 B2
(45) Date of Patent: Dec. 19, 2017

(54) THIN FILM TRANSISTOR THAT INCLUDES GROUP VB METAL OXIDE INSULATING LAYER

(71) Applicant: BOE TECHNOLOGY GROUP CO., LTD., Beijing (CN)

(72) Inventors: Yucheng Chan, Beijing (CN); Chienhung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/085,134

(22) Filed: Mar. 30, 2016

(65) Prior Publication Data

US 2016/0329356 A1 Nov. 10, 2016

(30) Foreign Application Priority Data

May 7, 2015 (CN) .......................... 2015 1 0230597

(51) Int. Cl.
*H01L 29/786* (2006.01)
*H01L 21/8234* (2006.01)
(Continued)

(52) U.S. Cl.
CPC .... *H01L 27/1248* (2013.01); *H01L 21/02183* (2013.01); *H01L 21/02244* (2013.01);
(Continued)

(58) Field of Classification Search
CPC ......... H01L 21/02244; H01L 21/02266; H01L 21/02183; H01L 2021/775; H01L 27/1248;
(Continued)

(56) References Cited

U.S. PATENT DOCUMENTS 5,028,122 A * 7/1991 Hamada ............ G02F 1/136213
345/92
8,324,079 B2 12/2012 Takahashi et al.
(Continued)

FOREIGN PATENT DOCUMENTS

CN 101919057 A 12/2010
CN 102714184 A 10/2012
(Continued)

OTHER PUBLICATIONS

T. Furukawa et al., "Flexible TFT Substrate, Manufacturing Method Thereof and Flexible Display", English Translation of JP 2008-159935 A, JPO, Jul. 2008.*
(Continued)

*Primary Examiner* — Stephen W Smoot
(74) *Attorney, Agent, or Firm* — Nath, Goldberg & Meyer; Joshua B. Goldberg; Annie Kock

(57) ABSTRACT

The present invention belongs to the field of display technology and provides a thin film transistor and a manufacturing method thereof, an array substrate and a display device. The thin film transistor comprises a gate, a source, a drain and a plurality of insulating layers, wherein at least one insulating layer comprises a Group VB metal oxide. Since the insulting layer is formed by using the Group VB metal oxide which has high dielectric constant, the thickness of the insulating layer can be reduced and the thin film transistor can be miniaturized.

10 Claims, 2 Drawing Sheets

(51) Int. Cl.
   *H01L 27/12*    (2006.01)
   *H01L 29/423*   (2006.01)
   *H01L 29/66*    (2006.01)
   *H01L 21/02*    (2006.01)

(52) U.S. Cl.
   CPC .... *H01L 27/1259* (2013.01); *H01L 29/42384* (2013.01); *H01L 29/66742* (2013.01); *H01L 29/66757* (2013.01); *H01L 29/786* (2013.01); *H01L 29/78606* (2013.01)

(58) Field of Classification Search
   CPC ............ H01L 27/1259; H01L 27/1266; H01L 29/42384; H01L 29/66742; H01L 29/6675; H01L 29/66757; H01L 29/786; H01L 29/78606
   See application file for complete search history.

(56) References Cited

U.S. PATENT DOCUMENTS

| | | |
|---|---|---|
| 8,400,817 B2 | 3/2013 | Yamazaki et al. |
| 2013/0092931 A1* | 4/2013 | Knutson ............. H01L 29/7869 257/43 |
| 2014/0011329 A1 | 1/2014 | Zhang et al. |
| 2015/0070643 A1* | 3/2015 | Kim .................. G02F 1/136213 349/139 |
| 2016/0043227 A1 | 2/2016 | Zhang et al. |

FOREIGN PATENT DOCUMENTS

| | | |
|---|---|---|
| CN | 103325840 A | 9/2013 |
| JP | 2008-159935 A * | 7/2008 |

OTHER PUBLICATIONS

Office Action dated Jun. 15, 2017 issued in corresponding Chinese Application No. 201510230597.3.

* cited by examiner

THIN FILM TRANSISTOR THAT INCLUDES GROUP VB METAL OXIDE INSULATING LAYER

FIELD OF THE INVENTION

The present invention belongs to the field of display technology, and particularly relates to a thin film transistor and a manufacturing method thereof, an array substrate and a display device.

BACKGROUND OF THE INVENTION

In a liquid crystal display device or an organic light-emitting diode (OLED) display device and the like, an array substrate is one of the important components. The array substrate includes a plurality of thin film transistors; each thin film transistor mainly includes a gate, an active layer, a source and a drain, wherein a gate insulating layer is arranged between the gate and the active layer. In addition, each thin film transistor may further include other insulating layers such as an inter-level dielectric (ILD) layer and the like between the source/drain and the active layer.

In the thin film transistor of the existing array substrate, the gate insulating layer is made of silicon oxide or silicon nitride of which the dielectric constant is relatively low and is about 3.9-7.9. Thus, the gate insulating layer is relatively thick (about 140-240 nm) in order to achieve enough insulation performance and storage capacitance, which is unfavorable for the miniaturization of the thin film transistor and hinders the improvement on the resolution of a display device. Moreover, the contact face between the gate and the gate insulating layer has many defects due to a great lattice constant difference between the materials of the gate and the gate insulating layer, so the gate insulating layer is also required to be relatively thick in order to make the lattices of the two to match with each other.

SUMMARY OF THE INVENTION

In view of the foregoing shortcomings of the existing thin film transistor, the present invention aims to provide a thin film transistor easy to be miniaturized and a manufacturing method thereof, an array substrate and a display device.

The above object of the present invention is achieved by providing a thin film transistor, which includes a gate, a source, a drain and a plurality of insulating layers and is characterized in that at least one insulating layer comprises a Group VB metal oxide.

Preferably, the Group VB metal oxide is an oxide of tantalum.

Further preferably, the oxide of tantalum is tantalum pentoxide and/or tantalum trioxide.

Preferably, the plurality of insulating layers includes a gate insulating layer comprising tantalum pentoxide and/or tantalum trioxide.

Preferably, the plurality of insulating layers further includes an inter-level dielectric layer and a planarization layer.

Preferably, the thickness of the gate insulating layer is in the range of 20-40 nm.

Preferably, the at least one insulating layer comprising the Group VB metal oxide is in contact with at least one of the gate, the source and the drain; and at least one of the gate, the source and/or the drain in contact with the at least one insulating layer comprising the Group VB metal oxide comprises the Group VB metal corresponding to the Group VB metal oxide.

Further preferably, the plurality of insulating layers include a gate insulating layer; the gate insulating layer comprises tantalum pentoxide and/or tantalum trioxide and is in contact with at least the gate; and the gate comprises tantalum.

Preferably, the at least one insulating layer is composed of a Group VB metal oxide.

Preferably, at least one of the gate, the source and/or the drain in contact with the at least one insulating layer comprising the Group VB metal oxide is composed of a Group VB metal corresponding to the Group VB metal oxide.

The present invention further provides an array substrate, including the thin film transistor of the present invention.

The present invention further provides a display device including an array substrate, wherein the array substrate includes the thin film transistor of the present invention.

The present invention further provides a method for manufacturing the thin film transistor of the present invention, including: forming a material comprising a Group VB metal oxide into the at least one insulating layer.

Preferably, the step of forming a material comprising a Group VB metal oxide into the at least one insulating layer includes: forming a layer by using a material comprising a Group VB metal through sputtering, then oxidizing the Group VB metal, thus forming the at least one insulating layer comprising the Group VB metal oxide.

The present invention achieves the following advantageous effects:

1. In the thin film transistor of the present invention, since the insulating layer is manufactured by using a Group VB metal oxide (e.g., the oxide of tantalum) which has relatively high dielectric constant, the insulating layer can meet the requirements for insulation performance, storage capacitance and the like even with low thickness. Thereby, the thickness of the insulating layer is reduced which is favorable for the miniaturization of the thin film transistor.

2. In a more preferable embodiment, at least one electrode in contact with the insulating layer comprising the Group VB metal oxide comprises the Group VB metal corresponding to the Group VB metal oxide, which results in the lattice constant of the insulating layer is closer to that of the electrode in contact with it and therefore the atom arrangement in the contact area of the two is more regular and the defects on the contact face are decreased. Thereby, the thickness of the insulating layer is reduced.

DESCRIPTION OF THE PREFERRED EMBODIMENT

Figure 1:
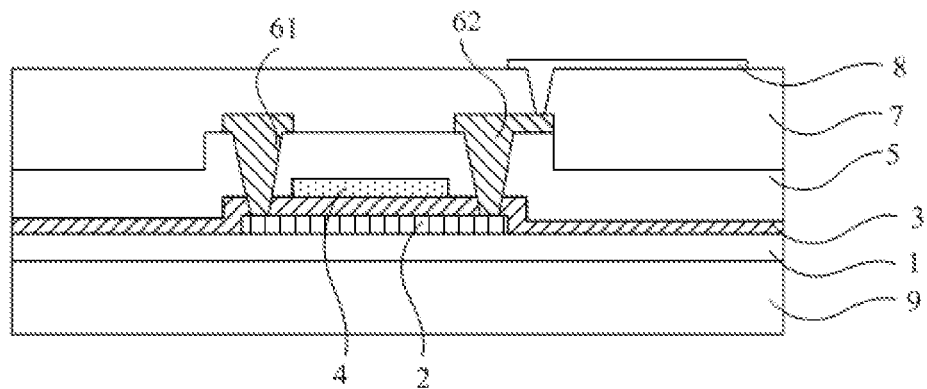
FIG. 1 is a schematic diagram showing a profile structure of an array substrate according to one embodiment of the present invention.
Figure 2:
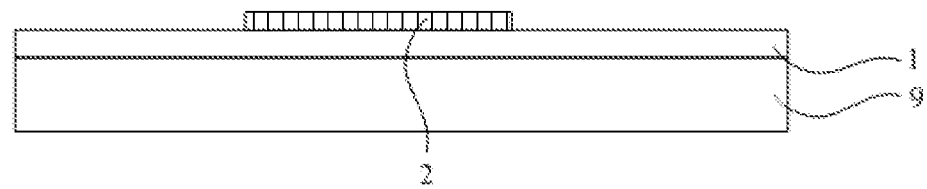
FIG. 2 is a schematic diagram showing a profile structure of an array substrate according to one embodiment of the present invention after an active layer is formed.

In order to make those skilled in the art have a better understanding of the technical solutions of the present invention, more detailed description towards the thin film transistor, the manufacturing method thereof, an array substrate and a display device of the present invention is provided below with reference to specific embodiments and the accompanying drawings.

The present invention provides a thin film transistor, which includes a gate, a source, a drain and a plurality of insulating layers and is characterized in that at least one insulating layer comprises a Group VB metal oxide.

For example, the Group VB metal oxide may be an oxide of vanadium, an oxide of niobium or an oxide of tantalum. Preferably, the Group VB metal oxide is an oxide of tantalum.

The oxide of tantalum is preferable because it has high dielectric constant (the dielectric constant of tantalum pentoxide is about 27) and an oxide thereof is easier to be formed relative to oxides of other Group VB metals.

More preferably, the oxide of tantalum is tantalum pentoxide and/or tantalum trioxide. Tantalum pentoxide and tantalum trioxide are the most common and most stable oxides of tantalum.

In an embodiment of the present invention, the plurality of insulating layers include a gate insulating layer which comprises a Group VB metal oxide, preferably comprises an oxide of tantalum, and more preferably comprises tantalum pentoxide and/or tantalum trioxide.

The plurality of insulating layers may further include an inter-level dielectric layer and a planarization layer, as well as other insulating layers that can be used for the thin film transistor known in the art. Depending on practical needs, these insulating layers may also comprise a Group VB metal oxide.

In the present invention, it is preferable that the gate insulating layer comprises a Group VB metal oxide, e.g., tantalum pentoxide and/or tantalum trioxide. That is because the gate insulating layer is most effective to be thinned among the insulating layers of the thin film transistor. However, taking the planarization layer for instance, it used for making the surface of the substrate as smooth as possible in addition to insulation, so even if the planarization layer is prepared by using a material with high dielectric constant, its thickness cannot be reduced significantly.

Specifically, in the present invention, the thickness of the gate insulating layer comprising a Group VB metal oxide (e.g., tantalum pentoxide and/or tantalum trioxide) can be in the range of 20-40 nm.

It can be seen that the gate insulating layer comprising a Group VB metal oxide with high dielectric constant of the present invention is much thinner than a gate insulating layer in the prior art.

It should be understood that the present invention is not intended to be limited to the above embodiments, and other insulating layers in the thin film transistor may also comprise a Group VB metal oxide.

Preferably, in the thin film transistor of the present invention, the insulating layer comprising the Group VB metal oxide is in contact with at least one of the gate, the source and the drain; and at least one of said electrodes in contact with the insulating layer comprises a Group VB metal corresponding to the Group VB metal oxide.

That is because the lattice constant of the insulating layer is preferably close to that of the electrode in contact with it, such that the atom arrangement in the contact area of the two is more regular and the defects on the contact face are decreased, which are benefit for the reduction of the thickness of the insulating layer. A metal (e.g., tantalum) and an oxide of the metal (e.g., oxide of tantalum) usually have similar lattice constant and therefore a lattice match therebetween can be achieved.

In an embodiment of the present invention, the thin film transistor includes a gate, a source, a drain and a plurality of insulating layers, wherein the plurality of insulating layers include a gate insulating layer which comprises tantalum pentoxide and/or tantalum trioxide and is in contact with at least the gate; and the gate comprises tantalum. In a specific embodiment, the gate insulating layer is in contact with the gate, the source and the drain, and the gate comprises tantalum.

In the thin film transistor of the present invention, the insulating layer comprising the Group VB metal oxide is preferably composed of the Group VB metal oxide. Preferably, at least one of the electrodes in contact with the insulating layer comprising the Group VB metal oxide is composed of the Group VB metal corresponding to the Group VB metal oxide.

In a specific embodiment of the present invention, as shown in FIG. 1, the thin film transistor includes a gate 4, a source 61, a drain 62 and a plurality of insulating layers, wherein at least one insulating layer comprises a Group VB metal oxide.

Specifically, the thin film transistor of this embodiment includes an active layer 2, a gate 4, a source 61 and a drain 62, wherein the source 61 and the drain 62 are respectively electrically connected with the active layer 2, and the active layer 2 is separated from the gate 4 by a gate insulating layer 3. Moreover, the thin film transistor may further include other insulating layers, e.g., an inter-level dielectric layer 5 disposed between the source 61/drain 62 and the gate 4, a planarization layer 7 covering the source 61 and the drain 62, etc. At least one of the insulating layers comprises a Group VB metal (such as vanadium, niobium and tantalum) oxide, such as an oxide of vanadium, an oxide of niobium and an oxide of tantalum. Since the Group VB metal oxide has high dielectric constant, when it is used for manufacturing an insulating layer, the insulating layer will meet the requirements for insulation performance, storage capacitance and the like even with low thickness. Therefore, the size of the thin film transistor can be reduced. The insulating layer is more preferably composed of a Group VB metal oxide.

Preferably, the insulating layer comprising the Group VB metal oxide is in contact with at least one of the gate 4, the source 61 and the drain 62, and among the gate 4, the source 61 and/or the drain 62 in contact with the insulating layer comprising the Group VB metal oxide, at least one electrode comprises a Group VB metal corresponding to the Group VB metal oxide.

Taking the gate insulating layer as an example, as shown in FIG. 1, the gate 4, the source 61 and the drain 62 of the thin film transistor are in contact with the gate insulating layer 3. When the gate insulating layer 3 comprises (more preferably, is composed of) a Group VB metal oxide, at least one of the gate 4, the source 61 and the drain 62 preferably comprises (more preferably, is composed of) the corresponding Group VB metal.

For example, if the gate insulating layer 3 comprises tantalum pentoxide and/or tantalum trioxide, the gate 4 preferably comprises tantalum. The source 61 and the drain 62 may or may not comprise tantalum.

The present invention further provides a method for manufacturing the thin film transistor of the present invention, including: forming a material comprising a Group VB metal oxide into at least one insulating layer.

Preferably, the step of forming a material comprising a Group VB metal oxide into at least one insulating layer includes: forming a layer by using a material comprising a Group VB metal through sputtering, then oxidizing the Group VB metal, thus forming the at least one insulating layer comprising the Group VB metal oxide.

The thin film transistor of the present invention can be manufactured by adopting conventional materials and methods for manufacturing a thin film transistor in the art, as long as at least one insulating layer is formed by a material comprising a Group VB metal (e.g., tantalum) oxide.

In a specific embodiment, the process for manufacturing the thin film transistor of the present invention includes the following steps, as shown in FIG. 1 to FIG. 6.

Step S101: a buffer layer 1 and an amorphous silicon (a-si) thin film (not shown) are sequentially formed on a substrate 9 along the thickness direction of the substrate 9 by a plasma enhanced chemical vapor deposition (PECVD) process.

Wherein, the substrate 9 may be made of glass and can be thoroughly cleaned before use. The buffer layer 1 may be a composite layer of silicon oxide and silicon nitride, wherein the thickness of the silicon oxide is in the range of 50-100 nanometers, and the thickness of the silicon nitride is in the range of 100-300 nanometers. The buffer layer 1 is mainly used for improving the bonding force between the active layer 2 and the substrate 9. The thickness of the amorphous silicon thin film may be in the range of 40-50 nanometers.

Step S102: the substrate 9 is heated at a high temperature, so that the amorphous silicon thin film is dehydrogenized till the mass percentage of hydrogen is less than 2% so as to avoid hydrogen explosion in the following process. Next, the substrate 9 is subjected to excimer laser annealer (ELA) to convert the amorphous silicon thin film into a polycrystalline silicon thin film. Then, the polycrystalline silicon thin film is patterned by a patterning process to form an active layer 2, thus obtaining the structure shown in FIG. 2.

Wherein, the patterning process includes the steps of forming a material layer, coating with a photoresist, exposing, developing, etching, peeling the photoresist and the like.

Figure 3:
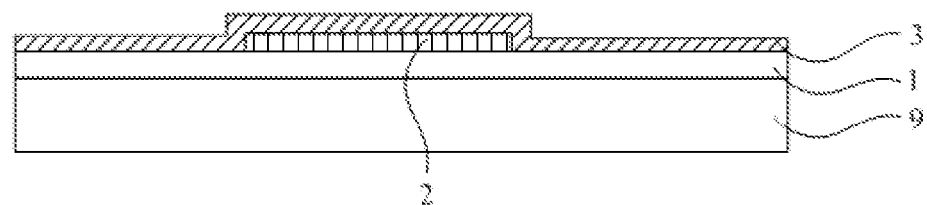
FIG. 3 is a schematic diagram showing a profile structure of an array substrate according to one embodiment of the present invention after a gate insulating layer is formed.

Step S103: a tantalum metal layer is deposited through sputtering process, and then the tantalum metal layer is formed into a layer of oxide of tantalum as a gate insulating layer 3 through hydrogen peroxide oxidation process, thus obtaining the structure shown in FIG. 3.

Wherein, the gate insulating layer 3 comprises tantalum pentoxide and/or tantalum trioxide (can be composed of tantalum pentoxide and/or tantalum trioxide), and has a thickness of 20-40 nm. The sputtering process for forming the gate insulating layer 3 can be performed by adopting conventional parameters.

Figure 4:
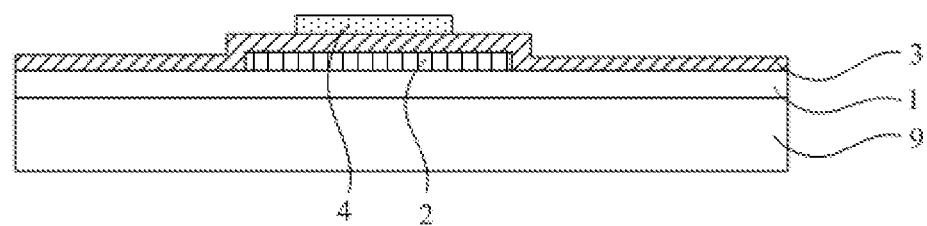
FIG. 4 is a schematic diagram showing a profile structure of an array substrate according to one embodiment of the present invention after a gate is formed.
Figure 5:
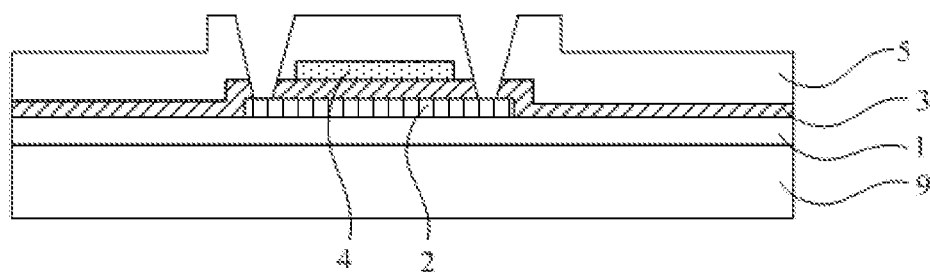
FIG. 5 is a schematic diagram showing a profile structure of an array substrate according to one embodiment of the present invention after an inter-level dielectric layer and through holes are formed.

Step S104: a gate metal layer is deposited on the gate insulating layer 3 through sputtering process, and a gate 4 is formed from the gate metal layer by photolithography (gate lines, common electrode lines and the like which are not shown in the figures may also be formed), thus obtaining the structure shown in FIG. 4.

Wherein, the gate 4 comprises tantalum (can be composed of tantalum) which easy to realize lattice matching with the gate insulating layer.

Step S105: an inter-level dielectric layer 5 (ILD), which is a composite layer of silicon nitride and silicon oxide, is formed through PECVD. Then, through holes connected to the active layer 2 are formed in the inter-level dielectric layer 5 and the gate insulating layer 3 by photolithography, thus obtaining the structure shown in FIG. 5. Thereafter, the formed structure is annealed at elevated temperature to diffuse the hydrogen in each insulating layer, so that the active layer 2 is hydrogenated to repair polycrystalline silicon hydrogen dangling bonds.

Figure 6:
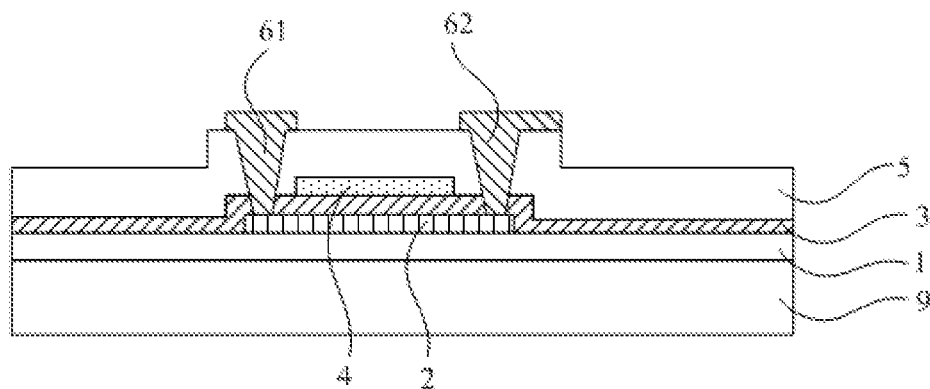
FIG. 6 is a schematic diagram showing a profile structure of an array substrate according to one embodiment of the present invention after a source and a drain are formed.

Step S106: a source/drain metal layer is formed through sputtering process, and a source 61 and a drain 62 are formed through a patterning process (data lines and the like which are not shown in the figures may also be formed), thus obtaining the structure shown in FIG. 6.

Step S107: optionally, in the event that the manufactured thin film transistor is used in an array substrate of a liquid crystal display device, a planarization layer 7 (PLN) may be formed, and a through hole connected to the drain 62 is formed in the planarization layer 7. Finally, a pixel electrode 8 connected with the drain 62 is formed through photolithography, thus obtaining the array substrate shown in FIG. 1.

Wherein, the planarization layer 7 can be formed by using photoresist through spin coating or the like, and the pixel electrode 8 can be made of a transparent conductive material (e.g., indium tin oxide, namely ITO).

It should be understood that the above manufacturing method is an exemplary example, wherein the specific structures, structure sequence, structure materials, processes, process parameters and the like can all be modified. For example, the thin film transistor can be of a bottom-gate type, each of the insulating layers may comprise an oxide of tantalum and the electrode in contact with the insulating layer may also comprise tantalum, and the source and the drain may also be in contact with the active layer directly.

The present invention further provides an array substrate including the thin film transistor of the present invention.

Since the array substrate adopts the thin film transistors of the present invention and each of the thin film transistors is relatively small, the array substrate can be miniaturized and the resolution of a display device can be improved.

Those skilled in the art could understand that besides the thin film transistor, the array substrate further includes leads such as gate lines, data lines and the like. When the gate, the source and the drain in the thin film transistor comprise a Group VB metal (e.g., tantalum), the leads (e.g., gate lines, data lines) arranged on the same layer with the gate, the source and the drain obviously should comprise the Group VB metal (e.g., tantalum).

Specifically, the array substrate of the present invention may be the one used in a liquid crystal display device, an organic light-emitting diode display device and the like. Depending on the specific type, the array substrate may further include other known structures such as pixel electrodes, a common electrode, an anode, a cathode, an organic light-emitting layer, a pixel defining layer and the like, which are not redundantly described herein.

The present invention further provides a display device including an array substrate, wherein the array substrate includes the thin film transistor of the present invention. The display device of the present invention may be any product or component with a display function, such as a liquid crystal display panel, electronic paper, an OLED panel, a mobile phone, a tablet computer, a television, a display, a notebook computer, a digital photo frame, a navigator or the like.

EXAMPLES

Advantages and embodiments of the present invention are further illustrated by the following examples, but the particular materials and amounts thereof recited in these examples, as well as other conditions and details, should not be construed to unduly limit the invention.

Example 1

Manufacturing of a Thin Film Transistor

The manufacturing process of the thin film transistor of this example is shown in FIG. 1 to FIG. 6, and includes the following steps.

Step S101: a buffer layer 1 and an amorphous silicon (a-si) thin film (not shown in the figures) are sequentially formed along the thickness direction on a substrate 9 by using a plasma enhanced chemical vapor deposition (PECVD) process under the operating environment of 390-420° C.

Wherein, the substrate 9 is made of glass and is thoroughly cleaned before use. The buffer layer 1 is a composite layer of silicon oxide and silicon nitride, wherein the thickness of the silicon oxide is 50-100 nanometers, and the thickness of the silicon nitride is 100-300 nanometers. The buffer layer 1 is mainly used for improving the bonding force between the active layer 2 and the substrate 9. The thickness of the amorphous silicon thin film is 40-50 nanometers.

Step S102: the substrate 9 on which the buffer layer 1 and the amorphous silicon thin film are formed is heated for 90-140 seconds at the high temperature of 390-420° C., so that the amorphous silicon thin film is dehydrogenized till the mass percentage of hydrogen is less than 2% (the hydrogen content is analyzed by a Fourier transform-infrared (FT-IR) spectrum analyzer) so as to avoid hydrogen explosion in the following process. Next, the substrate 9 is subjected to Excimer Laser Annealer (ELA), that is, amorphous silicon is scanned with laser having the energy density of 380-480 mj/cm$^2$ at the repetitive rate of 90-99%, to convert the amorphous silicon thin film into a polycrystalline silicon thin film. Then, the polycrystalline silicon thin film is patterned by a conventional patterning process to form an active layer 2, thus obtaining the structure shown in FIG. 2.

Wherein, the patterning process includes the steps of forming a material layer, coating with a photoresist, exposing, developing, etching, peeling the photoresist and the like.

Step S103: a tantalum metal layer having the thickness of about 30 nm is formed by using a sputtering process under the condition that the power is 10 kW and the air pressure is 0.3 Pa, and then the tantalum metal layer is soaked in a 30-60 wt % hydrogen peroxide solution for 2 minutes under the operating environment of 60° C. to form a layer of oxide of tantalum as a gate insulating layer 3, thus obtaining the structure shown in FIG. 3.

Wherein, the gate insulating layer 3 is composed of tantalum pentoxide and has a thickness of 30 nm.

Step S104: a gate metal layer having a thickness of about 220 nm is deposited on the gate insulating layer 3 through sputtering under the condition that the power is 10 kW and the air pressure is 0.3 Pa. A gate 4 is formed from the gate metal layer by conventional photolithography (gate lines, common electrode lines and the like which are not shown in the figures may also be formed), thus obtaining the structure shown in FIG. 4.

Wherein, the gate 4 is composed of tantalum so that it easy to realize lattice matching with the gate insulating layer.

Step S105: an inter-level dielectric (ILD) layer 5, which is a composite layer of silicon nitride and silicon oxide, is formed by PECVD at 390° C. under the condition that the power is 700 W and the air pressure is 1500 mtorr. Then, through holes connected to the active layer 2 are formed in the inter-level dielectric layer 5 and the gate insulating layer 3 by conventional photolithography, thus obtaining the structure shown in FIG. 5. Then, the structure is annealed at a high temperature of 680° C. for 100 seconds to diffuse hydrogen in each insulating layer, so that the active layer 2 is hydrogenated to repair polycrystalline silicon hydrogen dangling bonds.

Step S106: a source/drain metal layer is formed through sputtering under the condition that the power is 10 kW and the air pressure is 0.3 Pa. The source/drain metal layer is of a conventional structure and mainly has three layers, namely, titanium/aluminum/titanium. A source 61 and a drain 62 are formed by a conventional patterning process (data lines and the like which are not shown in the figures may also be formed)), thus obtaining the structure shown in FIG. 6.

Step S107: a planarization layer 7 (PLN) is formed by spin coating, and a through hole connected to the drain 62 is formed in the planarization layer 7 by conventional photolithography. Finally, a pixel electrode 8 connected with the drain 62 is formed by conventional photolithography, thus obtaining the array substrate shown in FIG. 1.

Wherein, the planarization layer 7 is made of a photoresist (PC 501 photoresist produced by JSR Company). The pixel electrode 8 is made of a transparent conductive material (e.g., indium tin oxide, namely ITO).

It should be understood that the above manufacturing method is an exemplary example, wherein the specific structures, structure sequence, structure materials, processes, process parameters and the like can all be modified. For example, the thin film transistor can be of a bottom-gate type, each of the insulating layers may comprise an oxide of tantalum and the electrode in contact with the insulating layer may also comprise tantalum, and the source and the drain may also be in contact with the active layer directly Examples 2 and 3

Manufacturing of a Thin Film Transistor

Thin film transistors are manufactured by the same method as described in Example 1 except for the differences that are listed in Table 1.

TABLE 1

| Examples | Gate insulating layer | Thickness of gate insulating layer (nm) | Gate |
| --- | --- | --- | --- |
| Example 2 | tantalum trioxide and tantalum pentoxide | 30 | tantalum |
| Example 3 | tantalum trioxide | 30 | tantalum |

It should be understood that the present invention is not intended to be limited to the embodiments set forth above for illustrative purposes. Various modifications and alterations of the invention will be apparent to those skilled in the art without departing from the scope and spirit of the invention. Such modifications and alterations are included in the scope of the present invention.

The invention claimed is:

1. A thin film transistor, comprising an active layer, a gate, a source, a drain, and a plurality of insulating layers, wherein one of the plurality of insulating layers, which is between the active layer and the gate, is defined as a gate insulating layer and at least the gate insulating layer is composed of a Group VB metal oxide, and
wherein the gate insulating layer is in contact with each of the gate, the source, and the drain,
wherein each of the gate, the source, and the drain in contact with the gate insulating layer comprises a Group VB metal corresponding to the Group VB metal oxide, and wherein the thickness of the gate insulating layer is in the range of 20-40 nm.

2. The thin film transistor of claim 1, wherein the Group VB metal oxide is an oxide of tantalum.

3. The thin film transistor of claim 2, wherein the oxide of tantalum is tantalum pentoxide and/or tantalum trioxide.

4. The thin film transistor of claim 1, wherein the gate insulating layer comprises tantalum pentoxide and/or tantalum trioxide.

5. The thin film transistor of claim 4, wherein the plurality of insulating layers further comprise an inter-level dielectric layer and a planarization layer.

6. The thin film transistor of claim 1, wherein,
the gate insulating layer comprises tantalum pentoxide and/or tantalum trioxide and is in contact with at least the gate; and
the gate comprises tantalum.

7. An array substrate, comprising the thin film transistor of claim 1.

8. A display device, comprising:
an array substrate comprising the thin film transistor of claim 1.

9. A method for manufacturing a thin film transistor, wherein the thin film transistor comprises an active layer, a gate, a source, a drain, and a plurality of insulating layers and wherein one of the plurality of insulating layers, which is between the active layer and the gate, is defined as a gate insulating layer and at least the gate insulating layer is composed of a Group VB metal oxide, wherein the gate insulating layer is in contact with each of the gate, the source, and the drain, and each of the gate, the source, and the drain in contact with the gate insulating layer comprises a Group VB metal corresponding to the Group VB metal oxide, and the method for manufacturing the thin film transistor comprises:
forming a material composed of a Group VB metal oxide into at least the gate insulating layer,
wherein the thickness of the gate insulating layer is in the range of 20-40 nm.

10. The method of claim 9, wherein the step of forming a material comprising a Group VB metal oxide into the gate insulating layer comprises:
forming a layer by using a material comprising a Group VB metal through sputtering, then oxidizing the Group VB metal, thus forming the gate insulating layer composed of the Group VB metal oxide.

* * * * *